United States Patent
Daubenspeck et al.

(10) Patent No.: US 7,256,503 B2
(45) Date of Patent: Aug. 14, 2007

(54) CHIP UNDERFILL IN FLIP-CHIP TECHNOLOGIES

(75) Inventors: Timothy Harrison Daubenspeck, Colchester, VT (US); Jeffrey Peter Gambino, Westford, VT (US); Christopher David Muzzy, Burlington, VT (US); Wolfgang Sauter, Richmond, VT (US); David L. Questad, Hopewell Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/276,380

(22) Filed: Feb. 27, 2006

(65) Prior Publication Data
US 2006/0108682 A1    May 25, 2006

(51) Int. Cl.
*H01L 23/48* (2006.01)
(52) U.S. Cl. ............... 257/778; 438/108; 257/E21.508
(58) Field of Classification Search ................ 257/737, 257/738, 773, 778, 789, 772; 438/108, 612, 438/613
See application file for complete search history.

(56) References Cited

U.S. PATENT DOCUMENTS

| | | |
|---|---|---|
| 2003/0107110 A1 | 6/2003 | Ma |
| 2004/0080043 A1* | 4/2004 | Tsai et al. .................... 257/723 |
| 2005/0074547 A1 | 4/2005 | Morganelli et al. |
| 2005/0146050 A1 | 7/2005 | Chen et al. |
| 2005/0170188 A1 | 8/2005 | Campbell et al. |
| 2005/0170630 A1 | 8/2005 | Kuo et al. |
| 2006/0071337 A1* | 4/2006 | Shi et al. ..................... 257/753 |
| 2006/0163749 A1* | 7/2006 | Lee et al. .................... 257/778 |

* cited by examiner

*Primary Examiner*—Quoc Hoang
(74) *Attorney, Agent, or Firm*—Schmeiser, Olsen & Watts; William D. Sabo

(57) ABSTRACT

A semiconductor structure and method for forming the same. The semiconductor structure includes (a) a substrate and (b) a chip which includes N chip solder balls, N is a positive integer, and the N chip solder balls are in electrical contact with the substrate. The semiconductor structure further includes (c) first, second, third, and fourth corner underfill regions which are respectively at first, second, third, and fourth corners of the chip, and sandwiched between the chip and the substrate. The semiconductor structure further includes (d) a main underfill region sandwiched between the chip and the substrate. The first, second, third, and fourth corner underfill regions, and the main underfill region occupy essentially an entire space between the chip and the substrate. A corner underfill material of the first, second, third, and fourth corner underfill regions is different from a main underfill material of the main underfill region.

20 Claims, 5 Drawing Sheets

CHIP UNDERFILL IN FLIP-CHIP TECHNOLOGIES

BACKGROUND OF THE INVENTION

1. Technical Field

The present invention relates to flip-chip technologies, and more specifically, to flip chip underfill in flip-chip technologies.

2. Related Art

In flip-chip technologies, chip solder balls are typically formed on top of a semiconductor chip and then the chip is flipped upside down and bonded to a substrate.

The difference in thermal expansion coefficients of the chip and the substrate may cause solder ball fatigue or cracking in the chip resulting in chip failure. Therefore, there is a need for a structure (and a method for forming the same) in which the difference between thermal expansion coefficients of the chip and the substrate does not cause solder ball fatigue or chip cracking as in the prior art.

SUMMARY OF THE INVENTION

The present invention provides a semiconductor structure, comprising (a) a substrate; (b) a chip which includes N chip solder balls, wherein N is a positive integer, and wherein the N chip solder balls are in electrical contact with the substrate; (c) a first corner underfill region, a second corner underfill region, a third corner underfill region, and a fourth corner underfill region which are respectively at a first corner, a second corner, a third corner, and a fourth corner of the chip, and which are sandwiched between the chip and the substrate; and (d) a main underfill region sandwiched between the chip and the substrate, wherein the first, second, third, and fourth corner underfill regions, and the main underfill region occupy essentially an entire space between the chip and the substrate, and wherein a corner underfill material of the first, second, third, and fourth corner underfill regions is different from a main underfill material of the main underfill region.

The present invention provides a semiconductor structure fabrication method, comprising providing a semiconductor structure which includes (a) a substrate, (b) a chip which includes N chip solder balls, wherein N is a positive integer, and wherein the N chip solder balls are in electrical contact with the substrate; after said providing is performed, forming a first corner underfill region, a second corner underfill region, a third corner underfill region, and a fourth corner underfill region which are respectively at a first corner, a second corner, a third corner, and a fourth corner of the chip, and which are sandwiched between the chip and the substrate; and after said forming the first, second, third, and fourth corner underfill regions is performed, forming a main underfill region sandwiched between the chip and the substrate, wherein the first, second, third, and fourth corner underfill regions, and the main underfill region occupy essentially an entire space between the chip and the substrate, and wherein a corner underfill material of the first, second, third, and fourth corner underfill regions is different from a main underfill material of the main underfill region.

The present invention provides a structure (and a method for forming the same) in which the difference between thermal expansion coefficients of the chip and the substrate does not cause solder ball fatigue or chip cracking.

DETAILED DESCRIPTION OF THE INVENTION

Figure 1A:
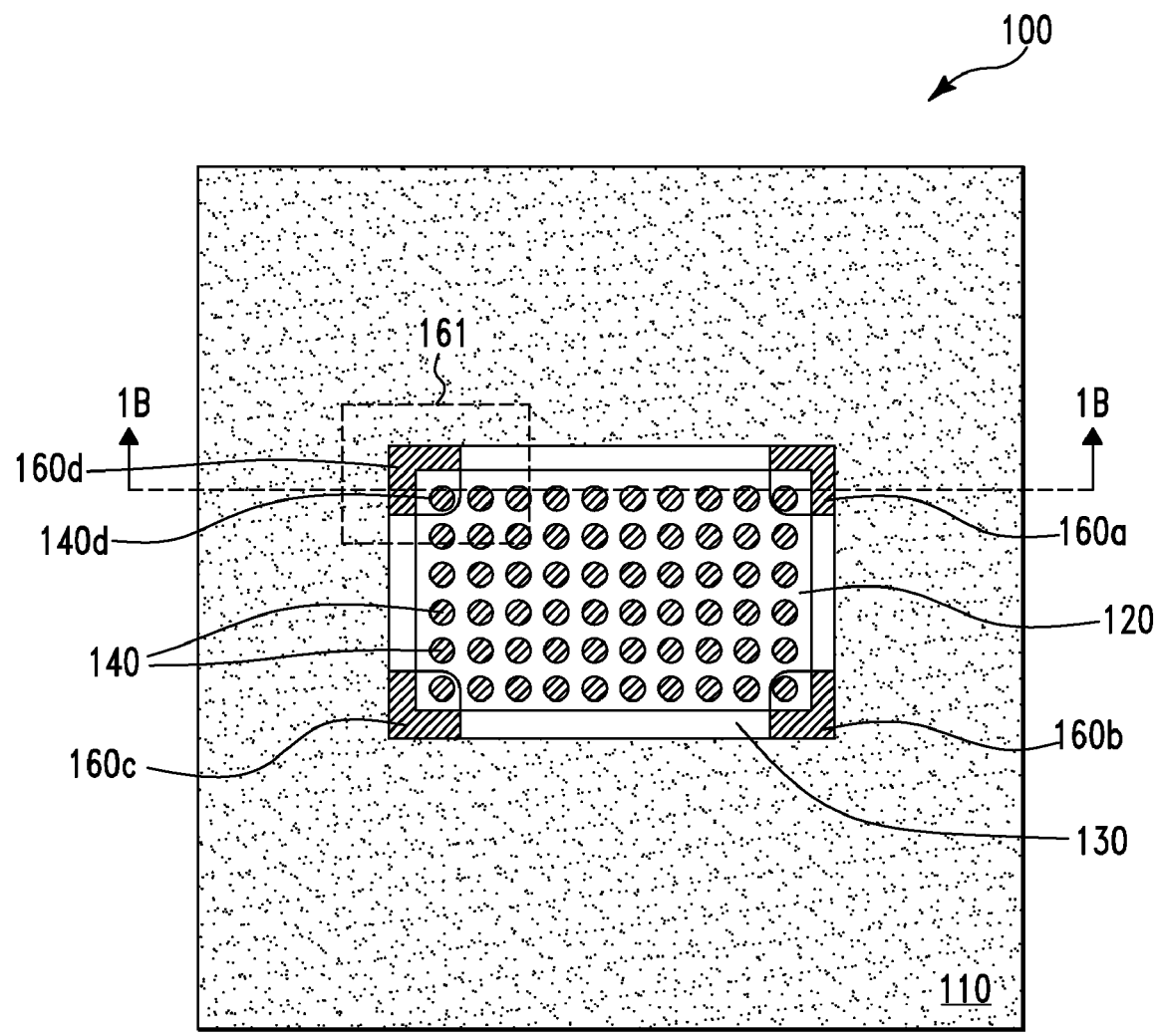
FIGS. 1A-1C illustrate a first semiconductor structure, in accordance with embodiments of the present invention.
Figure 1B:
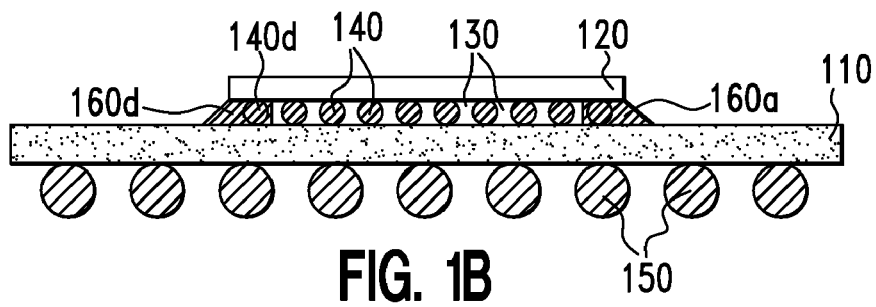

FIG. 1A illustrates a top down view of a semiconductor structure 100, in accordance with embodiments of the present invention. FIG. 1B illustrates a cross section view of the semiconductor structure 100 of FIG. 1A along a line 1B-1B. With reference to FIGS. 1A and 1B, in one embodiment, more specifically, the semiconductor structure 100 comprises a laminate substrate 110, an integrated circuit (chip) 120, a main underfill region 130, chip solder balls 140, and four corner underfill regions 160a, 160b, 160c, and 160d.

In one embodiment, the semiconductor structure 100 is formed according to the following fabrication process. Illustratively, the fabrication process starts with the formation of the chip 120. The chip solder balls 140 are then formed on top of the chip 120 wherein the chip solder balls 140 are electrically connected to devices (not shown) in the chip 120 via chip bond pads (not shown). Next, in one embodiment, the chip 120 is flipped upside down and bonded to the laminate substrate 110 such that the chip solder balls 140 of the chip 120 are directly and one-to-one bonded with substrate bond pads (not shown) on the laminate substrate 110. Next, in one embodiment, the four corner underfill regions 160a, 160b, 160c, and 160d are formed by dispensing a corner underfill material to the four corner spaces between the chip 120 and the laminate substrate 110. In one embodiment, the corner underfill material has a coefficient of thermal-expansion (CTE) in a range of 20-30 ppm/° C., has an elastic modulus (E) in a range of 7-10 Gpa, and has a glass transition temperature (Tg) in a range of 90-110° C. Next, in one embodiment, the main underfill region 130 is formed by dispensing a main underfill material to the remaining empty spaces between the chip 120 and the laminate substrate 110. In one embodiment, the main underfill material has a coefficient of thermal-expansion (CTE) of about 25 ppm/° C., has an elastic modulus (E) of about 9.5 Gpa, and has a glass transition temperature (Tg) of about 94° C.

In one embodiment, the laminate substrate 110 comprises substrate solder balls 150 which electrically connect the chip solder balls 140 to a printed wire board (not shown) via the conducting lines (not shown) in the laminate substrate 110. In one embodiment, the laminate substrate 110 comprises E679FG-R, a dielectric material made by Hitachi Semiconductor In one embodiment, the corner underfill material is selected so as to reduce thermo-mechanical strains of the chip solder balls 140 at four corner regions 160a, 160b, 160c, and 160d.

In one embodiment, the shape of the portions of the four corner underfill regions 160a, 160b, 160c, and 160d which are sandwiched between the chip 120 and the substrate 110 are approximately a quarter circle since the corner underfill material is dispensed by capillary action in all directions from the four corners. In one embodiment, the radius of the quarter circle shape is in a range of 0.5 mm-1.0 mm.

In one embodiment, the sizes and shapes of the chip solder balls 140 at the four corner regions of the chip 120 are chosen so as to reinforce the bond between the chip 120 and the laminate substrate 110 by (a) increasing the size of the footprint of the corner solder connection or by (b) placing additional, smaller dummy (non-functional) solder balls 140 at the four corner regions 160a, 160b, 160c, and 160d. More details are below with reference to FIG. 2 and FIG. 3.

Figure 1C:
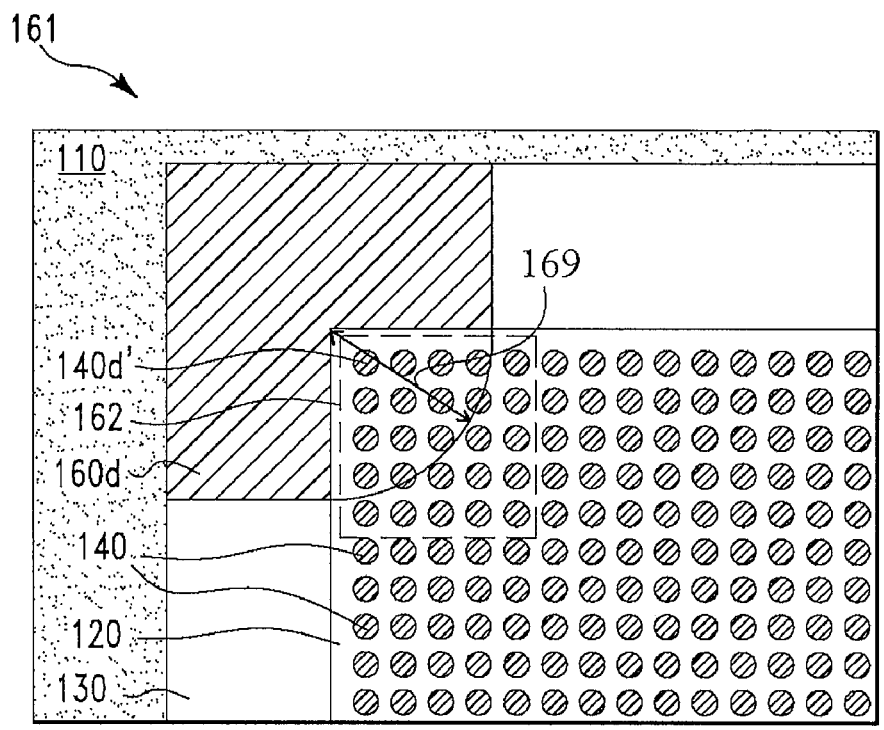

FIG. 1C illustrates an exploded view of a corner region 161 of the semiconductor structure 100 of FIG. 1A. For simplicity, in FIG. 1A, only one chip solder ball 140d is in the corner underfill region 160d of the semiconductor structure 100, but it should be understood that there may be multiple chip solder balls 140 in the corner underfill region 160d as shown in FIG. 1C. For simplicity, in FIG. 1A, the chip 120 has only 60 chip solder balls 140, but it should be understood that the chip 120 can have many more chip solder balls 140 than as shown in FIG. 1A such as shown in FIG. 1C. As can be seen in FIG. 1C, the shape of the portion of the corner underfill region 160d which is sandwiched between the chip 120 and the substrate 110 (i.e., the portion of the corner underfill region 160d which overlaps the chip 120) is approximately a quarter circle whose radius 169 is in a range of 0.5 mm-1.0 mm as described above with reference to FIG. 1A.

Figure 1D:
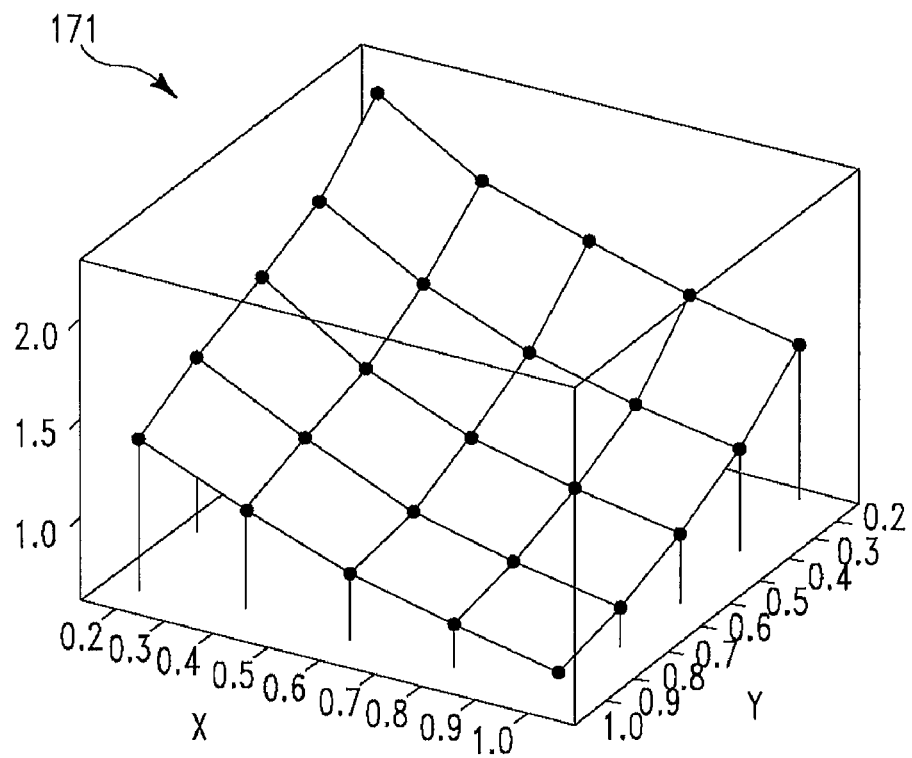
FIGS. 1D-1F illustrate modeling data of the strain of some chip solder balls of the semiconductor structure of FIG. 1A, in accordance with embodiments of the present invention.

FIG. 1D illustrates a strain distribution plot 171 for 25 chip solder balls 140 in a region 162 of FIG. 1C, for the case in which the main underfill material is used to form both the four corner underfill regions 160a, 160b, 160c, 160d and the main underfill region 130. It can be seen in FIG. 1D that, the maximum strain value of 2.16% corresponds to the chip solder ball 140d' in the region 162 of the chip 120.

Figure 1E:
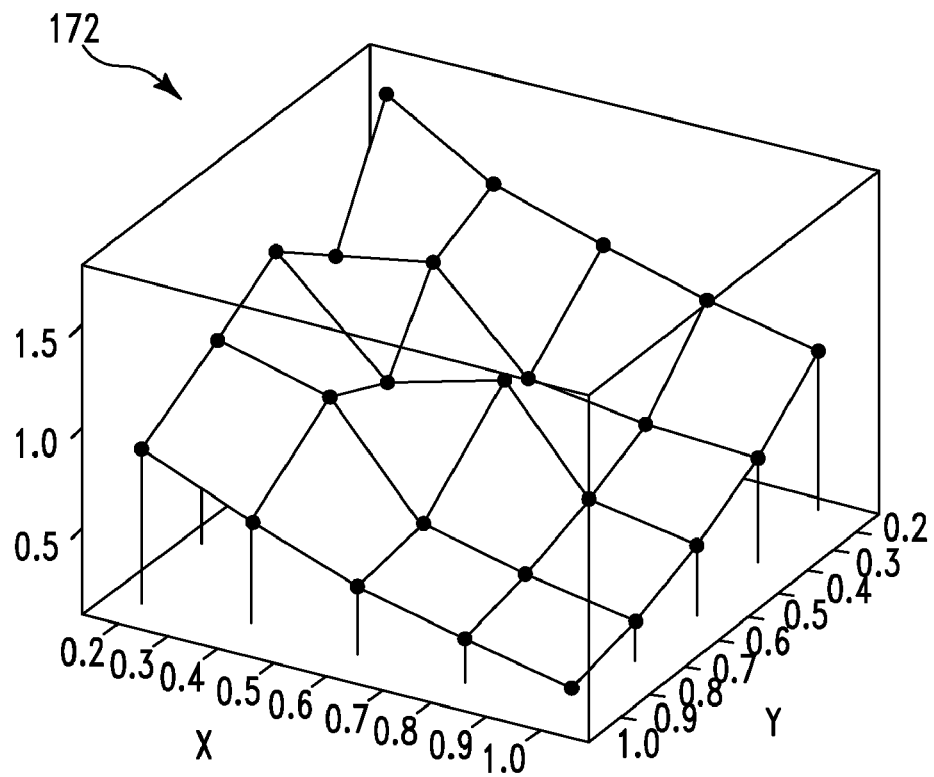

FIG. 1E illustrates a strain distribution plot 172 for the 25 chip solder balls 140 in the region 162 of FIG. 1C, for the case in which the main underfill material is used to form the main underfill region 130 whereas a first corner underfill material is used to form the four corner underfill regions 160a, 160b, 160c, and 160d, wherein the first corner underfill material has the following parameters: E (elastic modulus)=15 GPa, and CTE (coefficient of thermal-expansion) =12 ppm/° C. It can be seen in FIG. 1E that, the maximum strain value of 1.56%, corresponding to the chip solder ball 140d', is reduced compared with the value 2.16% for the case in which the main underfill material is used to form both the four corner underfill regions 160a, 160b, 160c, 160d and the main underfill region 130 (FIG. 1D).

Figure 1F:
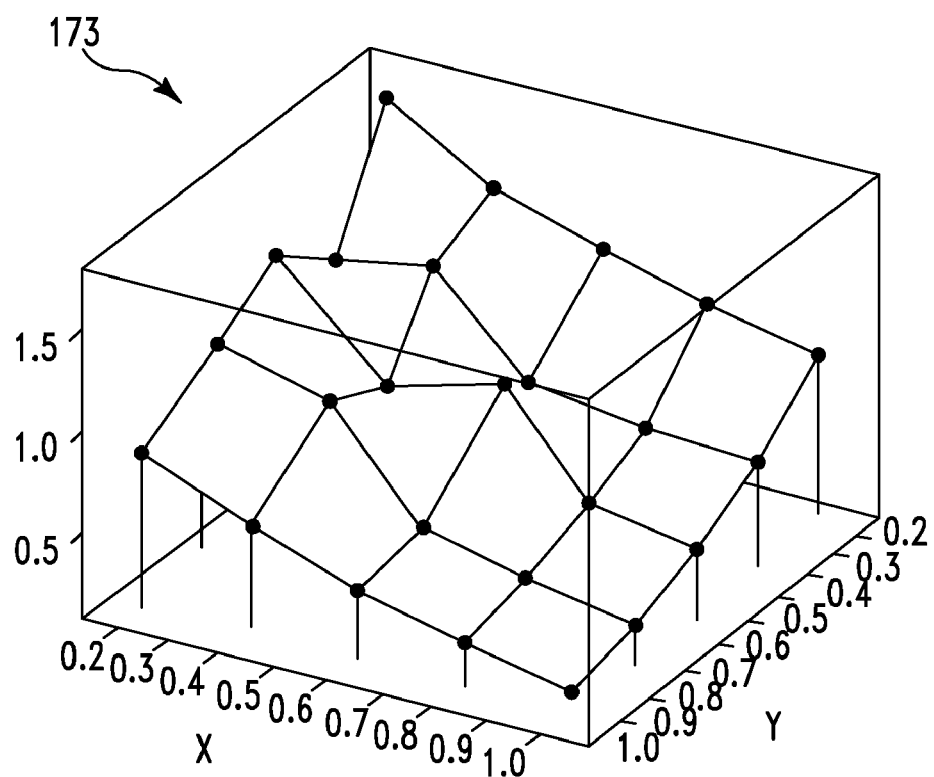

FIG. 1F illustrates a strain distribution plot 172 for 25 chip solder 140 in the region 162 of FIG. 1C, for the case in which the main underfill material is used to form the main underfill region 130 whereas a second corner underfill material is used to form the four corner underfill regions 160a, 160b, 160c, and 160d, wherein the second corner underfill material has the following parameters: E (elastic modulus)=24 GPa, and CTE (coefficient of thermal-expansion)=7 ppm/° C. It can be seen in FIG. 1F that, the maximum strain value of 1.52%, corresponding to the chip solder ball 140d', is reduced compared with the value 2.16% for the case in which the main underfill material is used to form both the four corner underfill regions 160a, 160b, 160c, 160d and the main underfill region 130 (FIG. 1D).

Figure 2A:
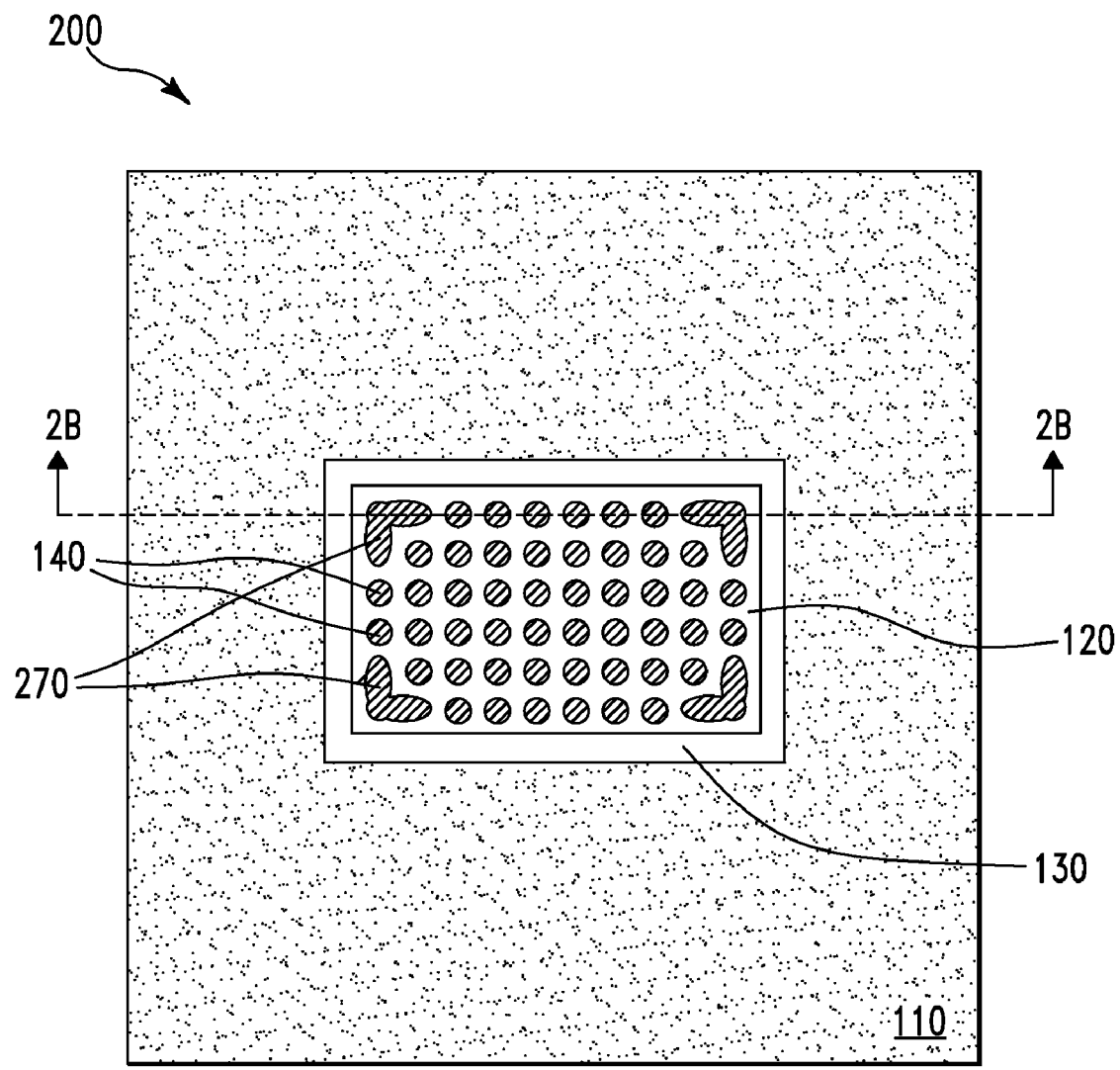
FIGS. 2A-2B illustrate a second semiconductor structure, in accordance with embodiments of the present invention.
Figure 2B:
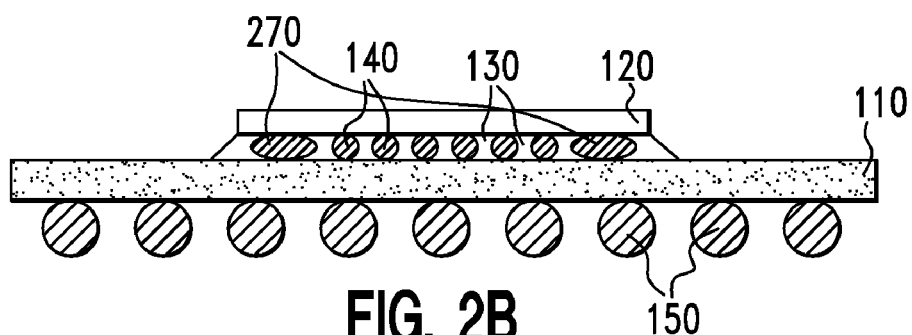

FIG. 2A illustrates a top down view of a semiconductor structure 200, in accordance with embodiments of the present invention. FIG. 2B illustrates a cross section view of the semiconductor structure 200 of FIG. 2A along a line 2B-2B. In one embodiment, with reference to FIGS. 2A and 2B, the structure of the semiconductor structure 200 is similar to the structure of the semiconductor structure 100 of FIGS. 1A and 1B, except that chip solder balls 270 at four corner regions of the chip 120 are formed larger in size than the other chip solder balls 140. In one embodiment, the chip solder balls 270 can have an "L" shape. As a result, the large chip solder balls 270 reinforce the bond between the chip 120 and the laminate substrate 110. Alternatively, the chip solder balls 270 can have any shape (e.g., triangle, etc.) In one embodiment, for the semiconductor structure 200, after the chip 120 is bonded to the laminate substrate 110, the main underfill material is dispensed to fill the entire empty spaces between the chip 120 and the laminate substrate 110 including the four corner regions of the chip 120. Alternatively, the corner underfill material is used to fill the empty spaces at the four corners of the chip 120 first and then the main underfill material is used to fill the remaining empty spaces between the chip 120 and the laminate substrate 110.

In one embodiment, the four corner regions of the chip 120 have a lower chip solder ball concentration than the other regions of the chip 120.

Figure 3A:
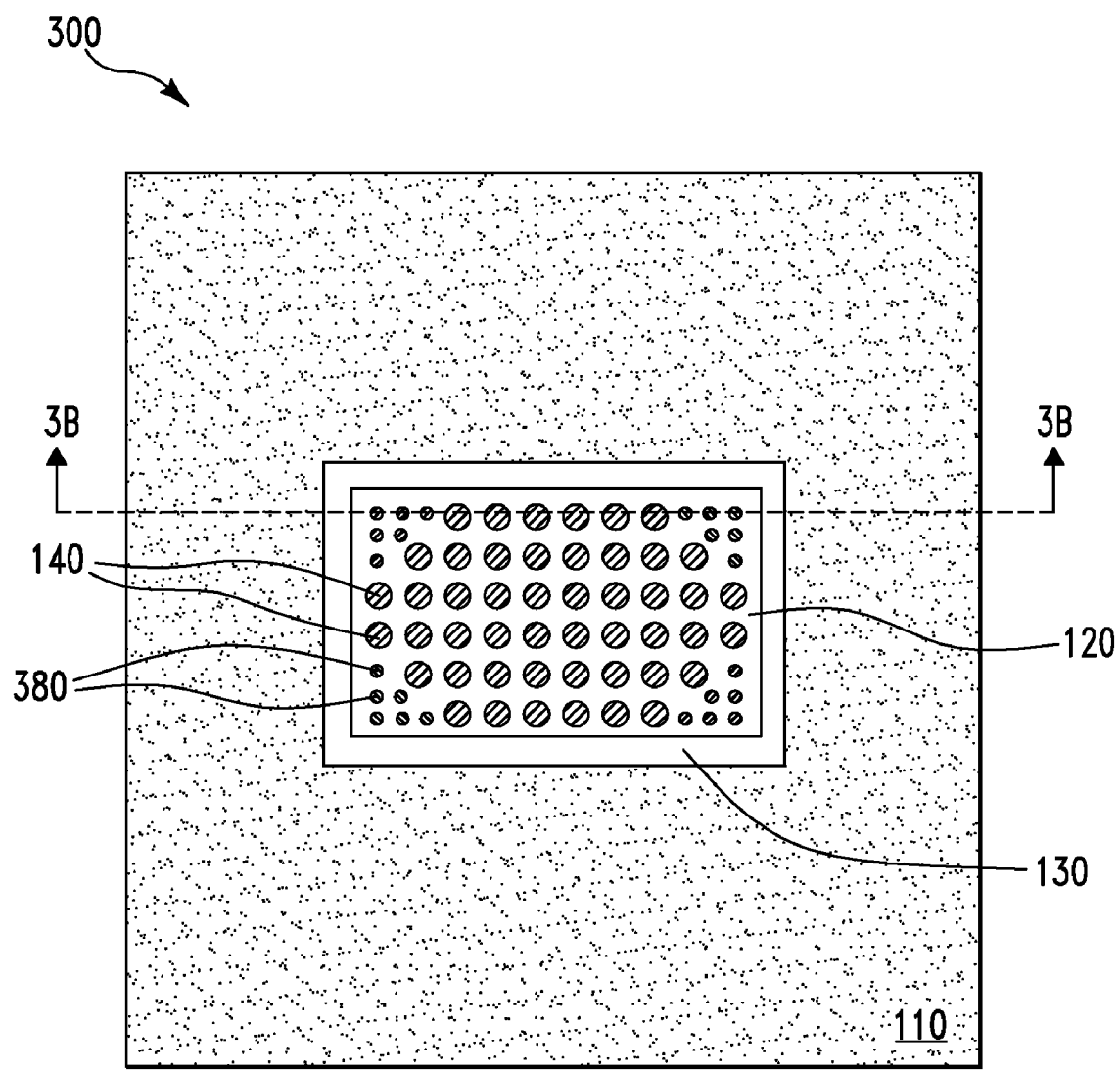
FIGS. 3A-3B illustrate a third semiconductor structure, in accordance with embodiments of the present invention.
Figure 3B:
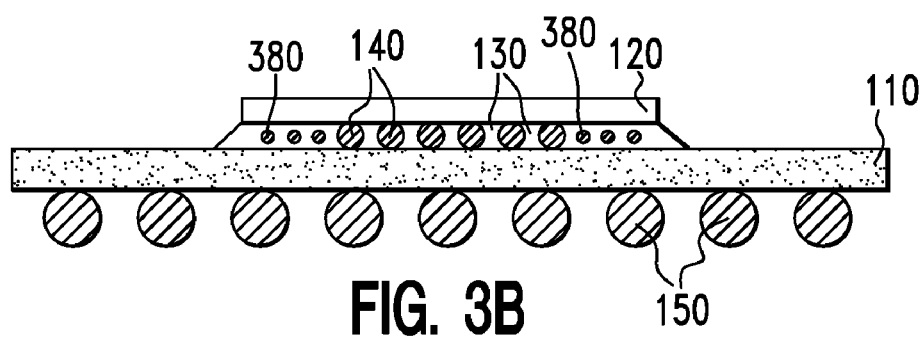

FIG. 3A illustrates a top down view of a semiconductor structure 300, in accordance with embodiments of the present invention. FIG. 3B illustrates a cross section view of the semiconductor structure 300 of FIG. 3A along a line 3B-3B. In one embodiment, with reference to FIGS. 3A and 3B, the structure of the semiconductor structure 300 is similar to the structure of the semiconductor structure 100 of FIGS. 1A and 1B, except that chip solder balls 380 at the four corner regions of the chip 120 are smaller in size than the other chip solder balls 140. As a result of having a smaller size, more chip solder balls 380 can be formed at the four corner regions of the chip 120. Therefore, more mechanical support can be achieved and more signals can be transmitted via the chip solder balls 380. In one embodiment, for the semiconductor structure 300, after the chip 120 is bonded to the laminate substrate 110, the main underfill material is dispensed to fill the entire empty spaces between the chip 120 and the laminate substrate 110 including the four corner regions of the chip 120. Alternatively, the corner underfill material is used to fill the empty spaces at the four corners of the chip 120 first and then the main underfill material is used to fill the remaining empty spaces between the chip 120 and the laminate substrate 110.

In one embodiment, the four corner regions of the chip 120 have a higher chip solder ball concentration than the other regions of the chip 120.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:
1. A semiconductor structure, comprising:
(a) a substrate;
(b) a chip which includes N chip solder balls,
wherein N is a positive integer,
wherein the N chip solder balls comprise a solder material, and
wherein the N chip solder balls are in electrical contact with the substrate;
(c) a first corner underfill region, a second corner underfill region, a third corner underfill region, and a fourth corner underfill region which are respectively at a first corner, a second corner, a third corner, and a fourth corner of the chip, and which are sandwiched between the chip and the substrate, wherein each corner underfill region of the first, second, third, and fourth corner underfill regions is in direct physical contact with at least one chip solder ball of the N chip solder balls; and (d) a main underfill region sandwiched between the chip and the substrate, wherein the first, second, third, and fourth corner underfill regions, and the main underfill region occupy essentially an entire space between the chip and the substrate, and wherein a corner underfill material of the first, second, third, and fourth corner underfill regions is different from a main underfill material of the main underfill region.

2. The structure of claim 1, wherein each corner underfill region of the first, second, third, and fourth corner underfill regions has essentially a quarter circle shape whose radius is in a range of 0.5 mm to 1 mm.

3. The structure of claim 1, wherein each of chip solder balls of the N chip solder balls in the first, second, third, and fourth corner underfill regions has a first size which is different from a second size of chip solder balls of the N chip solder balls in the main underfill region.

4. The structure of claim 3, wherein the first size is greater than the second size.

5. The structure of claim 3, wherein the first size is smaller than the second size.

6. The structure of claim 1, wherein a chip solder ball in the first corner region has an L shape.

7. The structure of claim 1, wherein a first concentration of chip solder balls in four corners of the chip is different from a second concentration of chip solder balls in other regions of the chip.

8. The structure of claim 7, wherein the first concentration is greater than the second concentration.

9. The structure of claim 7, wherein the first concentration is smaller than the second concentration.

10. The structure of claim 1, wherein the corner underfill material has a CTE (coefficient of thermal-expansion) in a range of 20-30 ppm/° C., and wherein the corner underfill material has a modulus in a range of 7-10 Gpa.

11. The structure of claim 1, wherein the corner underfill material has a glass transition temperature (Tg) in a range of 90-110° C.

12. A semiconductor structure fabrication method, comprising:

providing a semiconductor structure which includes (a) a substrate, (b) a chip which includes N chip solder balls, wherein N is a positive integer, wherein the N chip solder balls comprise a solder material, and wherein the N chip solder balls are in electrical contact with the substrate;

after said providing is performed, forming a first corner underfill region, a second corner underfill region, a third corner underfill region, and a fourth corner underfill region which are respectively at a first corner, a second corner, a third corner, and a fourth corner of the chip, and which are sandwiched between the chip and the substrate, wherein each corner underfill region of the first, second, third, and fourth corner underfill regions is in direct physical contact with at least one chip solder ball of the N chip solder balls; and after said forming the first, second, third, and fourth corner underfill regions is performed, forming a main underfill region sandwiched between the chip and the substrate, wherein the first, second, third, and fourth corner underfill regions, and the main underfill region occupy essentially an entire space between the chip and the substrate, and wherein a corner underfill material of the first, second, third, and fourth corner underfill regions is different from a main underfill material of the main underfill region.

13. The method of claim 12, wherein each corner underfill region of the first, second, third, and fourth corner underfill regions has essentially a quarter circle shape whose radius is in a range of 0.5 mm to 1 mm.

14. The method of claim 12, wherein each of chip solder balls of the N chip solder balls in the first, second, third, and fourth corner underfill regions has a first size which is different from a second size of chip solder balls of the N chip solder balls in the main underfill region.

15. The method of claim 12, wherein a chip solder ball in the first corner region has an L shape.

16. The method of claim 12, wherein a first concentration of chip solder balls in four corners of the chip is different from a second concentration of chip solder balls in other regions of the chip.

17. The method of claim 16, wherein the first concentration is greater than the second concentration.

18. The method of claim 16, wherein the first concentration is smaller than the second concentration.

19. The method of claim 12, wherein said forming the first, second, third, and fourth corner underfill region comprises dispensing the corner underfill material to the four corners of the chip resulting in the first, second, third, and fourth corner underfill region.

20. The method of claim 19, wherein said forming the main underfill region comprises dispensing the main underfill material to remaining empty spaces between the chip and the substrate resulting in the main underfill region.

\* \* \* \* \*